United States Patent [19]

Kishimoto et al.

[11] Patent Number: 5,315,131
[45] Date of Patent: May 24, 1994

[54] ELECTRICALLY REPROGRAMMABLE NONVOLATILE MEMORY DEVICE

[75] Inventors: Yoshio Kishimoto; Masaaki Suzuki, both of Hirakata, Japan

[73] Assignee: Matsushita Electric Industrial Co., Ltd., Osaka, Japan

[21] Appl. No.: 795,500

[22] Filed: Nov. 21, 1991

[30] Foreign Application Priority Data

Nov. 22, 1990 [JP] Japan ............................. 2-318733

[51] Int. Cl.$^5$ ............................................. H01L 45/00
[52] U.S. Cl. ........................................ 257/57; 257/61;
257/212; 257/314; 257/607
[58] Field of Search ............... 257/57, 58, 60, 52,
257/56, 61, 62, 212, 314, 607

[56] References Cited

U.S. PATENT DOCUMENTS

| | | | |
|---|---|---|---|
| 4,839,700 | 6/1989 | Ramesham et al. | 357/2 |
| 5,153,681 | 10/1992 | Kishimoto et al. | 257/40 |
| 5,172,204 | 12/1992 | Hartstein | 307/201 |

FOREIGN PATENT DOCUMENTS 63-200396 8/1988 Japan .
3-55878 3/1991 Japan .

OTHER PUBLICATIONS

*Solid State Communication*, vol. 73, No. 5, pp. 323–326, 1990 R. Konenkamp and E. Wild.

*Primary Examiner*—Sara W. Crane
*Attorney, Agent, or Firm*—Willian Brinks Hofer Gilson & Lione

[57] ABSTRACT

An electrically plastic device comprising an amorphous silicon semiconductor layer including movable dopant formed between a pair of electrodes and; at least one gate electrode formed on said amorphous silicon semiconductor layer through an insulation layer or a high resistance layer; whereby the operation of said gate electrode controls the dopant distribution of said amorphous semiconductor layer, thereby varying the electrical conductivity thereof.

12 Claims, 3 Drawing Sheets

ELECTRICALLY REPROGRAMMABLE NONVOLATILE MEMORY DEVICE

BACKGROUND OF THE INVENTION

1. Field of the Invention

The present invention relates to a semiconductor device used for information processing in a neural network and more particularly to an electrically reprogrammable nonvolatile memory device hereinafter referred to as an electrically plastic device which exhibits an electrically non-linear characteristic (conductivity or capacitance) in response to receiving an input energy (size or time variation).

2. Description of the Prior Art

Information processing in a neural network is known to be an excellent method for simulating the information processing of the human brain. However, it has been very difficult or almost impossible for the prior art to develop an electronic device provided with the ability the same as a synapse. This has been a big problem for the information processing devices.

A previously proposed neuron tip is classified into two groups; a semiconductor device and an optical device. The semiconductor device has a high potential for the practical realization of the neuron tip but is still not in a position to provide a plastic function suitable for the neuron tip. The previous development for the neural network has been directed to a modification of bipolar or CMOS silicon semiconductor provided with an analog operation.

On the other hand, attention has been increasingly paid to an electric field effect transistor (FET), a transconductance amplifier (OTA), a capacitor array, and a switched resistor array as possible electronic device 5 having the ability of the synapse for giving the neural network a plastic function. Among those possible devices, much attention has been directed to the FET such as a floating gate for use in EPROM and MNOS which is characterized by a low electric energy and a high gain.

An amorphous silicon has a number of irregular lattice defects and dangling bonds combined with hydrogen atoms in a different way from that of a single crystal silicon. Therefore, a molecular formula of the amorphous silicon is expressed exactly by $SiH_x$. The amorphous silicon has another feature that it can be formed into a porous structure. Accordingly, a dopant in the amorphous silicon can move freely throughout the defective lattice and controls the electric conductivity over a wide range. The reversible movement of the dopant in the amorphous silicon is disclosed in a paper, R. Konenkamp, Solid State Communication, 73 (5), p. 323 (1990). In addition, a conduction variable device using a conductive polymer is developed for the purpose of realizing an electrically plastic device (Japanese laid-open Patent Publication Sho. 63-2000396). However, neither of the above electronic devices are provided with sufficiently satisfactory characteristic for the electrically plastic device.

There has been no available electronic device which can be used for an electronically plastic device. Moreover, the requirement for an electrically plastic device has been increased in view of the need for more efficient information processing in the near future.

SUMMARY OF THE INVENTION

An object of the present invention is therefore to provide an electrically plastic device which solves the above problem.

A further object of the present invention is to provide an electrically plastic device characterized by a high gain and an excellent performance based on the description of Japanese laid-open Patent Publication No. Hei 3-55878 corresponding to Japanese Patent Application No. Hei 1-192961.

In order to achieve the aforementioned objective, the present invention provides an electrically plastic device comprising; an amorphous silicon semiconductor layer including movable dopant formed between a pair of electrodes; and at least one gate electrode formed on said amorphous silicon semiconductor layer through an insulating layer or a high-resistance layer; whereby the operation of said gate electrode controls the conductivity of said amorphous semiconductor layer in regulating the dopant distribution. It is desirable that the amorphous silicon semiconductor layer is superposed on a movable dopant supporting layer. Another preferable modification is that a dopant permeable separation layer is interposed between the amorphous silicon semiconductor layer and the movable dopant supporting layer.

DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
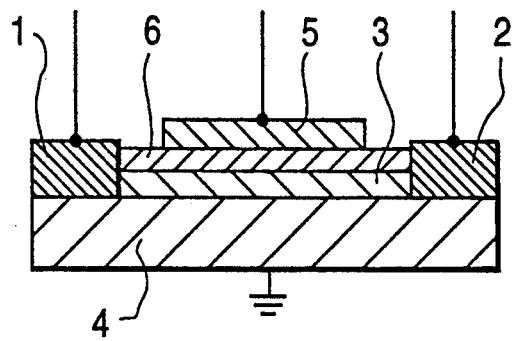
FIG. 1 is a cross-sectional view of the electrically plastic device according to one embodiment of the present invention.

Referring to FIG. 1 which is a cross-sectional view of the electrically plastic device according to one embodiment of the present invention, an ion conductive substrate 4 of glass or ceramic plate acts as a supporting layer for a movable dopant and has an amorphous silicon semiconductor layer 3, an insulating layer 6 and a gate electrode 5 formed thereon. A pair of electrodes 1 and 2 are formed on the ion conductive substrate 4 so as to come in contact with the insulating layer 6 and the amorphous silicon semiconductor layer 3. The insulating layer 6 can be substituted with a high-resistance layer. This structure is suitable for the case in which the movable dopant supporting layer is composed of an ion conductive substrate made of a glass or ceramic plate. On the other hand, a polymeric compound instead of the glass or ceramic can be used for the ion conductive substrate acting as a movable dopant supporting layer. In this case, the electrically plastic device can be more easily manufactured in a reverse order to that for the glass or ceramic plate. More specifically, an aluminum plate having an aluminum oxide film formed thereon is used for a gate electrode. The next step is to form an amorphous silicon layer on the aluminum oxide film and a movable dopant supporting layer on the amorphous silicon layer.

Figure 2:
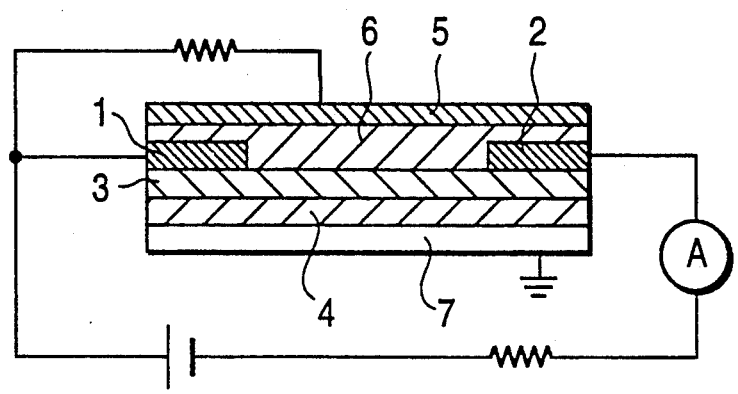
FIG. 2 is a cross-sectional view for showing the electrically plastic device and its circuit having two terminals according to another embodiment of the present invention.

Referring to FIG. 2 which shows an electrically plastic device and its circuit having two terminals according to another embodiment of the present invention, an ion conductive substrate 7 has a movable dopant supporting layer 4 formed thereon. An amorphous silicon semiconductor layer 3 is formed on the movable dopant supporting layer 4 and has a pair of electrodes 1 and 2 formed at this terminals thereof. A gate electrode 5 is formed between the pair of electrodes 1 and 2 through an insulating layer 6.

The resultant device can be operated in a high speed and a high sensitivity mode when the electrodes 1 and 2 (source and drain) are formed between the amorphous silicon layer and the movable dopant supporting layer as shown in FIG. 1.

A structure having the movable dopant supporting layer 4 integrated with the amorphous silicon semiconductor layer 3 is an essential part of the electrically plastic device according to the present invention. A more useful structure having a threshold value for controlling the movement of the dopant can be achieved by providing a dopant permeable separation layer between the amorphous silicon semiconductor layer and the movable dopant supporting layer in accordance with the present invention. The dopant permeable separation layer is electrically insulating and precisely controls the movement of the dopant to stabilize the switching characteristics between the pair of electrodes (source and drain).

A dopant permeable separation layer can be composed of a porous film having an ion permeable property and suitably composed of a separator material for use in a battery.

Figure 4:
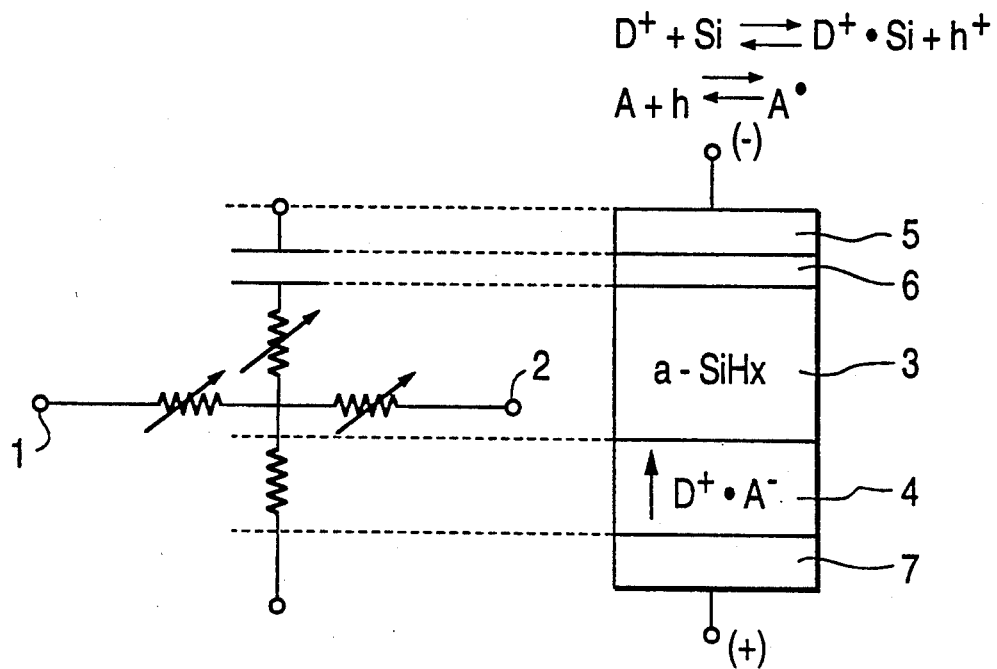
FIG. 4 is an equivalent circuit illustrating the operation of the electrically plastic device according to the present invention.

Referring to FIG. 4 which is an equivalent circuit illustrating the operation of the electrically plastic device according to the present invention, a cation dopant $D^+$ is movable and has a polarity reverse to that of the carrier of the amorphous silicon semiconductor so as to move depending on the voltage applied across the electrodes. The impedance between electrodes 1 and 2 (i.e., channel impedance) markedly varies with the movement of the cation dopant, which is greatly affected by the electric charge and ion radius of the dopant and the structure and the density of the amorphous silicon semiconductor, among other things. FIG. 4 shows a case in which the amorphous silicon semiconductor and the cation dopant are used for illustration purposes, but it should be noted that the scope of the present invention is not limited to the case using the cation dopant.

Figure 5:
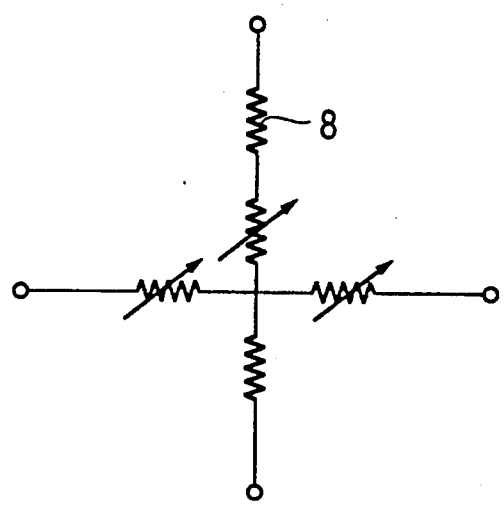
FIG. 5 is an equivalent circuit of a modification of the electrically plastic device according to the present invention.

An insulating layer at the gate can be substituted with a high-resistance layer 8 as shown in FIG. 5 which is an equivalent circuit of the substituted device. The high-resistance layer 8 preferably has a high resistivity ranging from $10^5$ to $10^{12}$ ohm-cm. It is necessary for the as-doped amorphous silicon semiconductor layer 3 positioned between the pair of electrodes to have a markedly higher conductivity than the movable dopant supporting layer 4 as shown clearly in the equivalent circuit shown in FIG. 5.

The device according to the present invention is characterized in that the amorphous silicon layer exhibits a large change in the conduction thereof with a magnitude ranging from $(\times 10^4)$ to $(\times 10^8)$ which thereby varies the conductor between the electrodes 1 and 2 (i.e., source and drain). In addition, since it is possible to apply an electric field with a high intensity to the gate in the thickness direction, the response speed of the device can be greatly improved.

Figure 3:
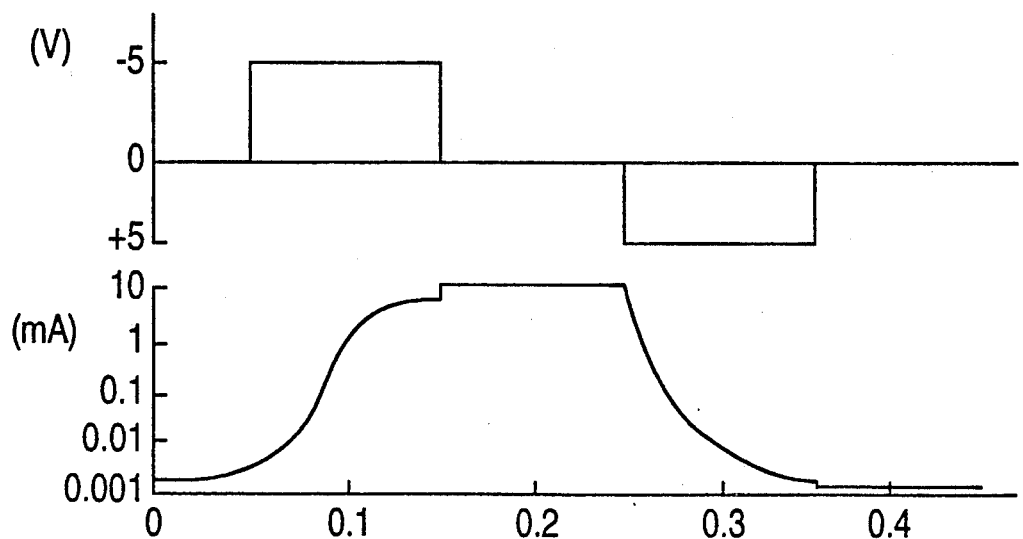
FIG. 3 is a graph showing a relationship between a gate voltage and a drain current of the electrically plastic device according to the present invention.
Figure 6:
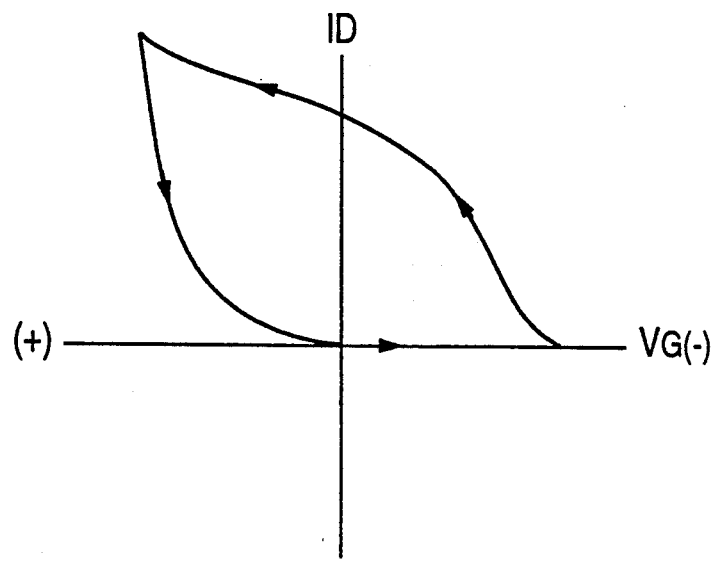
FIG. 6 is a graph showing a relationship between the gate voltage and the drain current of the electrically plastic device according to the present invention.
Figure 7:
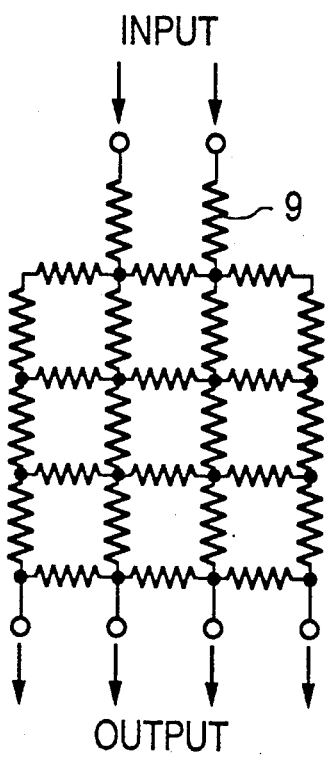
FIG. 7 is a block diagram of a neural network formed by using a plurality of the electrically plastic devices according to the present invention.

FIG. 3 is a graph showing, as an example, a controlling operation characteristic of the electrically plastic device according to the present invention comprising an n-type amorphous silicon semiconductor and the cation dopant. It is noted that FIG. 3 shows a case in which the movement of the dopant is shorter than the pulse width, so that in response to the negative gate pulse a learning operation is carried out and in response to the positive gate pulse a reset operation is carried out. A neural network can be formed by using a plurality of these elements as shown in FIG. 7. In the neural network, the elements after undergoing the learning operation have a very low impedance. The neural network executes the learning or the reset in a time of msec order but can operate preferably at a high speed of micro sec order after the learning. The operation of this neural network can be expressed by an $I_D-V_G$ characteristic as shown in FIG. 6, which corresponds to a characteristic obtained by combining the enhancement form and the depression form of a MOSFET.

The amorphous silicon semiconductor layer 3 can be formed by various methods such as evaporation, glow discharge sputtering, CVD, MBE and the like. The electrically plastic device according to the present invention can be formed by using an electrically conductive polymer. The amorphous silicon semiconductor layer is different from the conductive polymer in that the amorphous silicon semiconductor layer does not show any expansion and shrinkage during the doping and de-doping of the dopant. It is possible to change the electronic structure of the amorphous silicon semiconductor layer by chemically modifying the surface of the amorphous silicon semiconductor layer with a chemical or physical absorption or the chemical bonding. The resistivity of the amorphous silicon semiconductor layer can be changed by doping non-movable dopant and can form either an n-type or p-type semiconductor. The non-movable dopant interacts with the movable dopant to change the resistivity of the amorphous silicon semiconductor layer in an adjusting way. In addition, the interaction between the non-movable dopant and the movable dopant can be used as a threshold value control. In view of the impedance, the neural network is preferably formed from the amorphous silicon semiconductor layer having a high electric resistance. It is not suitable for the neural network to consist of the semiconductor having the non-movable dopant in a high concentration doped therein.

The movable dopant supporting layer is a layer in which the dopant moves easily, and preferably exhibits low conductivity. In general, the movable dopant supporting layer consists of an ion-conductive material such as glass, ceramic or organic material. The glasses or ceramics can be used both as an electric conduction substrate in addition to the movable dopant supporting layer. Material suitable for the movable dopant supporting layer is an ion conductive glass or ceramic conductor including an alkali ion such as Na-$\beta$-Al$_2$O$_3$, Na$_x$-WO$_3$, a proton conductor, reversible ion conductor containing Ag$^{30}$ or cu$^{30}$ ion and sodium glass. Another suitable material is a porous ceramic such as zeolite, or lithium ion-or halogen ion-containing conductor. It is possible to use a polyion complex compound or an ion-conductive polymeric compound. Further the movable dopant supporting layer can be formed from an anisotropic conduction film which is of a high insulating property in a parallel direction to the film and of a high conduction property in a perpendicular direction to the film. In the device according to the present invention, the amorphous silicon semiconductor layer produces the movement of the dopant due to the operation of the gate electrode, upon having the dopant injected therein. On the other hand, ions of the reverse polarity remaining at the movable dopant supporting layer are subjected to a redox (reduction and oxidation reaction). Therefore, the movable dopant supporting layer must be composed of a material to contain the movable dopant stable and reversible against the redox. It is desirable that the movable dopant supporting layer consists of ion-conductive glasses or ceramics forming a complex compound with the movable dopant. This structure provides the electrically plastic device with the threshold value characteristic and the ensured memory characteristic. An ion inclusion compound can be used for this structure. The electronic redox usually occurs with the movement of the movable dopant at the operation of the gate electrode but can be made reversible and stable with this structure of the device according to the present invention. An electrically plastic device according to the present invention is not limited to the structure shown in FIGS. 1 and 2 and can be formed into a structure having a substrate of a silicon single crystal which has an insulating film of SiO$_2$ formed thereon.

An use of a plurality of the electrically plastic devices according to the present invention makes it possible to form an integrated circuit in a similar way to the fabrication process of semiconductor integrated circuits and to accomplish neuron tips.

The following description is directed to an embodiment of the present invention.

EXAMPLE 1

A pair of electrodes 1 and 2 are formed on an ion-conductive sodium glass substrate 4 having Na ions as ion carriers as shown in FIG. 1. An amorphous silicon semiconductor layer 3 in a thickness of 10 millimeter is formed on the sodium glass substrate 4. A gate electrode 5 is formed on the amorphous silicon semiconductor layer 3 through an insulating layer 6.

An electrically plastic device can be formed into a structure described above and a pulse voltage is applied to the gate electrode for the operation. As a result, the electrically plastic device according to the present invention shows a non-linear switching characteristic as shown in FIG. 3.

Based on this characteristic, a negative gate pulse is applied to execute the learning and a positive gate pulse is applied for the purpose of the reset.

A network shown in FIG. 7 is formed from a plurality of the electrically plastic devices and are supplied with a gate voltage applied to terminals at given positions. Then, the devices positioned on a line of the shortest distance between the output and input terminals exhibits a low impedance. Accordingly, the devices can study a relation between the output signal and the input signal through the variation in the electric resistance.

EXAMPLE 2

Referring to FIG. 2, an ion conductive ceramic layer 4 in a thickness of 1 mm having a Na-$\beta$-aluminum oxide layer in a thickness of 3 $\mu$m and an amorphous silicon semiconductor layer 3 in a thickness of 1 $\mu$m are formed sequentially on a substrate 7. A pair of electrodes 1 and 2 are formed on the amorphous silicon semiconductor layer 3. Then, a gate electrode 5 is formed on the amorphous silicon semiconductor layer 3 through an insulating layer 6 as shown in FIG. 2 so as to complete an electrically plastic device.

The gate and the source of the electrically plastic device are short circuited so that a negative gate pulse of 10 V is applied for the purpose of the learning and the positive gate pulse of 10 V is applied for the purpose of the reset. A channel impedance shows a variation of 10$^6$ ohm between the operations of the negative and positive gate pulses.

A network shown in FIG. 7 is formed from a plurality of the electrically plastic devices. Then, by repeating the learning, a low impedance can be obtained with the devices positioned on a line of the shortest distance between the output and input terminals. Accordingly, the network can study a relation between the output signal and the input signal by the variation in the electric resistance.

EXAMPLE 3

An amorphous silicon semiconductor layer having a thickness of 3 $\mu$m is formed on a silicon substrate having a silicon dioxide film formed thereon. A pair of Au-Ni electrodes are formed on the amorphous silicon semiconductor layer and a movable dopant supporting layer in a thickness of 5 $\mu$m is formed on the semiconductor layer between the pair of electrodes. The movable dopant supporting layer is composed of tungsten bronze compound (Na$_x$WO$_3$) having Na$^{30}$ ions as an ion carrier. An electrically plastic device obtained in such a way can be operated by using the silicon substrate as a gate electrode and exhibits a switching characteristic and a source-drain current-time characteristic similar to those of the Example 1. A neural network is formed by using a plurality of these electrically plastic devices. The operation of the neural network produces a network having a resistance pattern corresponding to a learning signal.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:
1. An electrically plastic device comprising:
   a pair of electrodes;
   an amorphous silicon semiconductor layer comprising a movable dopant support layer for imparting the electronic conductivity of said amorphous sili- con semiconductor layer, said amorphous silicon semiconductor layer formed between said pair of electrodes; said movable dopant support layer comprising at least one element selected from the group consisting of an alkali ion conductor based on β-aluminum oxide, a redox ion conductor including Ag+ or Cu+, and a porous ceramic;

an insulating layer formed on said amorphous silicon semiconductor layer; and at least one gate electrode formed on said insulating layer for applying an electric field to control the dopant distribution of said amorphous semiconductor layer; whereby the electronic conductivity of said amorphous semiconductor layer is variable by controlling the dopant distribution of said amorphous semiconductor layer.

2. An electrically plastic device according to claim 1, wherein said pair of electrodes and amorphous silicon semiconductor layer are formed on a substrate composed of an ion-conductive glass or ceramic plate, said substrate acting as said movable dopant support layer.

3. An electrically plastic device according to claim 2, wherein a dopant permeable separation layer is interposed between said amorphous silicon semiconductor layer and said movable dopant supporting layer.

4. The electrically plastic device of claim 1, wherein said insulating layer comprises a high-resistance layer.

5. An electrically plastic device comprising:

an ion conductive substrate comprising a movable dopant support layer; said movable dopant support layer comprising at least one element selected from the group consisting of an alkali ion conductor based on β-aluminum oxide, a redox ion conductor including Ag+ or Cu+, and a porous ceramic;

a pair of electrodes formed on said ion conductive substrate;

an amorphous silicon semiconductor layer formed on said ion conductive substrate so as to contact said pair of electrodes;

an insulating layer formed on said amorphous silicon semiconductor layer and between said pair of electrodes; and at least one gate electrode formed on said insulating layer for applying an electric field to control the flow of ions between said ion conductive substrate and said amorphous silicon semiconductor layer;

whereby the resistance of said amorphous silicon semiconductor layer is variable by controlling the ion content of said amorphous silicon semiconductor layer.

6. The electrically plastic device of claim 5, wherein said ion conductive substrate comprises ion-conductive glass or ceramic plate.

7. The electrically plastic device of claim 5, further comprising a dopant permeable separation layer interposed between said amorphous silicon semiconductor layer and said ion conductive substrate.

8. The electrically plastic device of claim 5, wherein said insulting layer comprises a high-resistance layer.

9. An electrically plastic device comprising:

a substrate;

a movable dopant supporting layer formed on said substrate; said movable dopant support layer comprising at least one element selected from the group consisting of an alkali ion conductor based on β-aluminum oxide, a redox ion conductor including Ag+ or Cu+, and a porous ceramic;

an amorphous silicon semiconductor layer formed on said movable dopant layer;

a pair of electrodes formed on said amorphous silicon semiconductor layer;

an insulating layer formed on said amorphous silicon semiconductor layer and between said pair of electrodes; and at least one gate electrode formed on said insulating layer for applying an electric field to control the flow of ions between said movable dopant supporting layer and said amorphous silicon semiconductor layer;

whereby the resistance of said amorphous silicon semiconductor layer is variable by controlling the ion content of said amorphous silicon semiconductor layer.

10. The electrically plastic device of claim 8, wherein said movable dopant supporting layer comprises ion-conductive glass or ceramic thin film.

11. The electrically plastic device of claim 9, further comprising a dopant permeable separation layer interposed between said amorphous silicon semiconductor layer and said movable dopant supporting layer.

12. The electrically plastic device of claim 9, wherein said insulating layer comprises a high-resistance layer.

* * * * *